United States Patent
Tchamov et al.

Patent Number: 5,942,928
Date of Patent: Aug. 24, 1999

[54] MULTIVIBRATOR CIRCUIT

[76] Inventors: Nikolay Tchamov, Lindforsinkatu 21 A 17, Tampere, Finland, FIN-33720; Petri Jarske, Pirilänkuja 8, Kämmenniemi, Finland, FIN-34240

[21] Appl. No.: 08/981,993
[22] PCT Filed: May 7, 1997
[86] PCT No.: PCT/FI97/00277
§ 371 Date: Mar. 27, 1998
§ 102(e) Date: Mar. 27, 1998
[87] PCT Pub. No.: WO97/43831
PCT Pub. Date: Nov. 20, 1997

[30]    Foreign Application Priority Data

May 9, 1996  [FI]  Finland ...................................... 961982

[51] Int. Cl.$^6$ ....................................................... H03K 3/282
[52] U.S. Cl. ............................ 327/227; 327/229; 327/190; 331/113 R
[58] Field of Search ............................ 331/113 R, 113 A, 331/117 R, 117 FE, 144, 167; 327/190, 227, 228, 229

[56]    References Cited

U.S. PATENT DOCUMENTS

| | | | |
|---|---|---|---|
| 4,910,472 | 3/1990 | Tanino | 331/113 R |
| 5,418,497 | 5/1995 | Martin | 331/48 |
| 5,760,619 | 6/1998 | Yamaguchi | 327/110 |
| 5,825,256 | 10/1998 | Tchamov et al. | 331/113 R |

*Primary Examiner*—Tuan T. Lam
*Attorney, Agent, or Firm*—Scully, Scott, Murphy & Presser

[57]    ABSTRACT

An emitter-coupled multivibrator circuit comprises two transistors (Q1, Q2), between which a positive feedback is provided by connecting each transistor base via buffer transistors (Q3, Q4) to the collector of the other transistor. In the multivibrator, the transistors (Q1, Q2, Q3, Q4) are connected to operating voltages via coils (L1, L2, L3, L4, L5, L6) instead of using conventional resistors and current sources. This lowers the necessary operating voltage, since no DC voltage loss is provided across the coils. Additionally, this improvement increases amplification during the avalanche process and thus the speed of the whole circuit. Further at high frequencies, the waveform of a signal is closer to a sinusoidal form. The speed of the circuit can be increased further by providing an electromagnetic coupling between the coils (L1, L2, L3, L4, L5, L6).

11 Claims, 2 Drawing Sheets

MULTIVIBRATOR CIRCUIT

FIELD OF THE INVENTION

The invention relates generally to oscillator circuits and particularly to oscillator circuits based on multivibrators.

BACKGROUND OF THE INVENTION

Different kinds of oscillator circuits, i.e. oscillators, are used for a very great number of applications of the electronics and the telecommunications technology. Typical applications of the telecommunications technology are Phase-Locked Loops (PLL), frequency oscillators, modulators, etc.

Oscillator circuits, i.e. oscillators, can be implemented by many different circuit structures. One of them is an astable (free-running) multivibrator.

FIG. 1 shows a conventional emitter-coupled multivibrator circuit. The circuit comprises two transistors Q1 and Q2, between which is provided a positive feedback by connecting each transistor collector via a buffer transistor Q3, Q4 to control a base of the other transistor. In some known solutions Rc1 and Rc2 are replaced by coils. Collectors of Q1 and Q2 are connected via the resistors Rc1 and Rc2, respectively, to one potential of an operating voltage source 1 and emitters are connected via current sources 3 and 4, respectively, to the lower potential of the operating voltage source. Correspondingly, emitters of the buffer transistors Q3 and Q4 are connected via current sources 5 and 6 to the lower potential. Additionally, a capacitance C is connected between the emitters of Q1 and Q2. The positive feedback and series resonance circuits Rc1-C and Rc2-C constituted by the resistors RC1 and RC2 and the capacitance C lead to that the multivibrator output oscillates continuously between two states, after the oscillation once has been trigged. The oscillation frequency is determined by component values of the RC series resonance circuits. The oscillation frequency can be controlled by changing some of these component values, typically the capacitance C.

In the following, the operation of the multivibrator will be examined closer. To begin with, it is assumed that Q1 and Q3 are off (non-conduction state). When Q1 is off, the collector of Q1 and the base of Q2 are generally at the operating voltage potential. Then Q2 is on (conducting state) and its emitter current is I1+I2. Likewise the buffer transistor Q4 is on and feeds base current to Q2. When Q2 is conductive, the current I1 flows from the emitter of Q2 via the capacitance C to the emitter of Q1. Then the current I1 charges/discharges the charge of the capacitance C, whereby the emitter potential of Q1 falls at a predetermined speed until Q1 becomes conductive when the base emitter voltage of Q1 exceeds appr. 0.6 V. When Q1 becomes conductive, its collector voltage begins to fall, due to which the buffer transistor Q3 begins to close. On account of the positive feedback provided via Q4, the base voltage of Q2 falls as well and Q2 closes. Q2 closing makes the collector voltage of Q2 increase, which accelerates the opening of Q3. Q3 opening increases, via positive feedback, the base current of Q1. A higher base current discharges parasitic capacitances of the base circuit of Q1 faster and accelerates thus the opening of Q1. When Q2 is off and Q1 is on, the current I2 flows from the emitter of Q1 via the capacitance C to the emitter of Q2, where the emitter voltage begins to fall until it makes Q2 open and, via Q3, Q1 close again. The speed of such a multivibrator circuit (maximum resonance frequency) depends primarily on the properties of the transistors Q1, Q2, Q3 and Q4. Nowadays, there is a need of ever-increasing-speeds, however.

The minimum operating voltage required by a multivibrator of above type is about 1.5 V, from which at least 0.4 to 0.5 V is used across the current sources 3, 4, 5 and 6. However, especially in electronic equipments using battery power supplies, lower operating voltages would be desired.

SUMMARY OF THE INVENTION

An object of the present invention is to increase the speed of a multivibrator circuit.

Another object of the present invention is to lower the operating voltage of the multivibrator.

Still another object of the present invention is a simpler frequency control of the multivibrator.

The invention relates to a multivibrator circuit, comprising an operating voltage source, a first non-linear amplifier component comprising a first and a second main electrode and a control electrode, a second non-linear amplifier component comprising a first and a second main electrode and a control electrode, a third amplifier component, in which the main electrodes are connected to the control electrode of the first amplifier component and to a first potential of the operating voltage source and the control electrode is connected to the first main electrode of the second amplifier component in such a way that a positive feedback is provided, a fourth amplifier component, in which the main electrodes are connected to the control electrode of the second amplifier component and to the first potential of the operating voltage source and the control electrode is connected to the first main electrode of the first amplifier component in such way that a positive feedback is provided, a capacitive component connected between the second main electrode of the first amplifier component and the second main electrode of the second amplifier component, a first inductive component, via which the first main electrode of the first amplifier component is connected to the first potential of the operating voltage source, a second inductive component, via which the first main electrode of the second amplifier component is connected to the first potential of the operating voltage source. The multivibrator is characterized in that it comprises a third inductive component, via which the second main electrode of the first amplifier component is connected to a second potential of the operating voltage source, a fourth inductive component, via which the second main electrode of the second amplifier component is connected to the second potential of the operating voltage source.

In the present invention, the operating rate of a multivibrator circuit is increased by increasing the speed of so-called avalanche processes in the amplifier components. Avalanche processes signify a property of a circuit to move in a self-amplifying manner like an avalanche from one state to another, and they are dominant processes at extremely high operating frequencies.

In a conventional multivibrator circuit, resistors are used between the first main electrodes (e.g. collectors) of the amplifier components and the operating voltage. In a multivibrator according to the invention, the first main electrodes of the amplifier components are connected to the operating voltage via a first and a second inductive component, respectively. This improvement lowers the necessary operating voltage, because no DC voltage loss is provided across an inductive component. Additionally, this improvement increases the amplification during avalanche process and thus the speed of the whole circuit. Further at high frequencies, the wave form of a signal is closer to the sinusoidal form.

In a conventional multivibrator circuit, between the second main electrodes (e.g. emitters) of the amplifier components and a second operating voltage, current sources are used the main object of which is to keep the current of the main electrode constant. In a multivibrator of the invention, the second main electrodes of the amplifier components are also connected to the operating voltage via a third and a fourth inductive component, respectively. In a preferred embodiment of the invention, the second main electrodes of the buffer transistors, too, are connected to the operating voltage via a fifth and a sixth inductive component, respectively. These improvements lower the necessary operating voltage further, because no DC voltage loss is provided across an inductive component, as it does across current sources. This improvement also intensifies the operation of the circuit during avalanche process and thus the speed of the whole circuit.

According to the invention, an electromagnetic coupling (inductive coupling dominant) is provided between at least two inductive components in such a way that the currents flowing in those have an electromagnetic interaction, which intensifies the positive feedback between the amplifier components of the multivibrator. This extra electromagnetic "feedback" intensifies in turn the avalanche process significantly and thus the speed of the whole circuit. As to the manufacturing technique, an advantageous way of implementing two inductive components and their electromagnetic coupling is a coil provided with a tap.

In an embodiment of the invention, this electromagnetic coupling exists between the first and the second inductive component. Additionally, or alternatively, there may exist a corresponding electromagnetic coupling also between the third and the fourth inductive component. In addition to these, or alternatively, a corresponding electromagnetic coupling may exist between the fifth and the sixth inductive component. If all electromagnetic couplings are implemented in the same multivibrator circuit, the positive feedback and thus the speed of the whole circuit increases further.

In still another embodiment of the invention, an electromagnetic coupling is provided between all inductive components. In other words, for instance the currents of the first and the second inductive component interact, except with each other, also with the third and the fourth, the fifth and the sixth inductive component. This intensifies the positive feedback further and increases thus the speed of the whole circuit. As to the manufacturing technique, an advantageous way of implementing a coupling between all inductive components is a transformer having three windings provided with a tap.

A preferable feature of the multivibrator circuit of the invention is that a reactive impedance of the capacitor of the multivibrator circuit and the inductive components connected thereto determine the current flowing through them in the avalanche process. The resonance frequency depends on this current. Because this current is simple to control, the frequency control of the multivibrator circuit according to the invention can be implemented in a simpler manner than in the present circuits.

BRIEF DESCRIPTION OF THE DRAWINGS

In the following, the invention is described with reference to the attached drawings, in which.

PREFERRED EMBODIMENTS OF THE INVENTION

The present invention is applicable to lowering the operating voltage and increasing the speed of so-called emitter-coupled multivibrator circuits. Although the multivibrator circuit according to the prior art shown in FIG. 1 and the multivibrator circuits of the invention shown in FIGS. 2 to 5 use bipolar transistors as amplifier means, the circuit solutions according to the invention may use any type of nonlinear amplifier components, in principle, such as MOS, CMOS, SOI, HEMT and HBT transistors, microwave tubes and vacuum tubes. The names of the electrodes may vary in these components. The main electrodes of a bipolar transistor are a collector and an emitter and the control electrode constitutes a base. In FETs, the corresponding electrodes are a drain, a source and a gate. In vacuum tubes, these electrodes are usually called an anode, a cathode and a gate. Thus the term emitter-coupled multivibrator shall also be understood in this connection as a more general concept, covering e.g. the terms cathode-coupled or source-coupled multivibrator.

Figure 2:
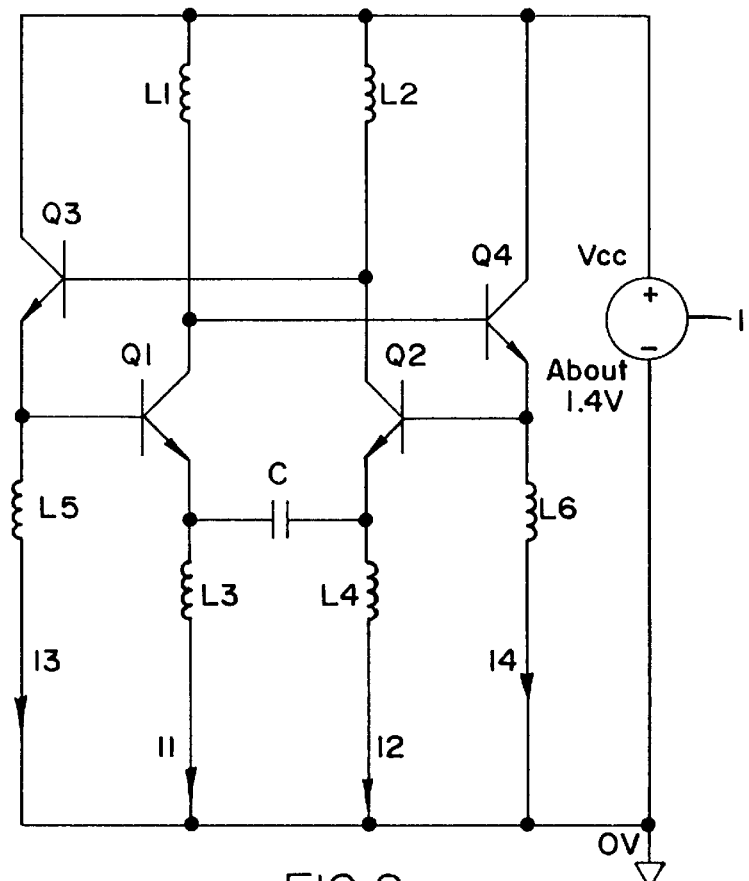
FIGS. 2, 3 and 4 are circuit diagrams showing different multivibrator circuits according to the invention.

FIG. 2 shows an emitter-coupled multivibrator circuit according to a first embodiment of the invention. The circuit comprises four NPN transistors Q1 to Q4. A collector electrode of the transistor Q1 is connected via a coil L1 to a positive operating voltage Vcc of an operating voltage source 1, and an emitter is connected via a coil L3 to a lower operating voltage potential, e.g. 0 V, of the voltage source 1. A collector of the transistor Q2 is connected via a coil L2 to the operating voltage Vcc and an emitter via a coil L4 to the operating voltage 0 V.

A capacitor C is connected between the transistors Q1 and Q2. A positive feedback is provided between the transistors Q1 and Q2 by cross-connecting the collector of Q2 via a buffer transistor Q3 to a base of Q1 and the collector of Q1 via a buffer transistor Q4 to a base of Q2. To put it more exact, a base of Q3 is connected to the collector of Q2, an emitter to the base of Q1 and a collector to the operating voltage Vcc. Further, an emitter of Q3 is connected via a coil L5 to the operating voltage 0 V. A base of Q4 is connected to the collector of Q1, an emitter to the base of Q2 and a collector to the operating voltage Vcc. Additionally, an emitter of Q4 is connected via a coil L6 to the operating voltage 0 V.

The positive feedback and series resonance circuits L1-C-L4 and L2-C-L3 constituted by the coils L1 to L4 and the capacitor C provide that a multivibrator output (e.g. emitter of Q2) oscillates between two states, when the oscillation once has been triggered. The operation of the circuit requires a relatively high resonance frequency, typically at least about 1 GHz. The resonance frequency of the circuit is set by the values of the components L1, L2, L3, L4 and C. The resonance frequency can be controlled 1) by controlling the values of these components in a manner known per se or 2) by controlling the current flowing through the capacitor C and the coils L3, L4, as will be explained below. Within the resonance frequency range of 1 to 10 GHz, the values of the coils L1 to L4 are typically of an order of 1 to 10 nH and the value of the capacitor C of an order of 1 to 5 pF. In the multivibrator circuit of the invention, the coils L1 and L2 replace the resistors Rc1 and Rc2 of a conventional multivibrator circuit shown in FIG. 1. The coils L1 and L2 lower the operating voltage Vcc, because no DC voltage loss is provided across them. The coils L3 to L6 replacing the current sources 3 to 4 of the conventional multivibrator circuit (FIG. 1) have a similar affect. So the potentials occurring at the collectors and emitters of the transistors Q1 to Q4 are Vcc and 0 V, in practice.

Figure 1:
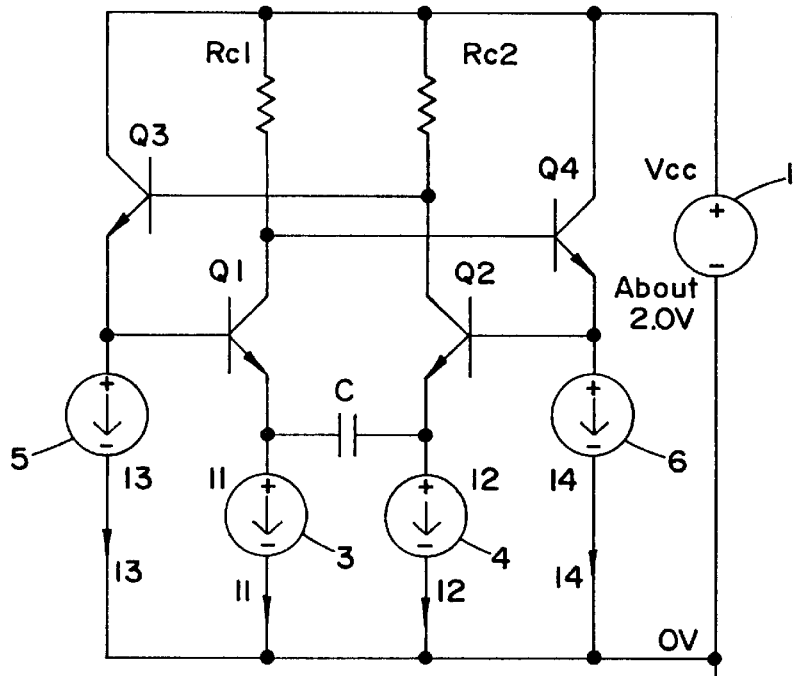
FIG. 1 is a circuit diagram showing an emitter-coupled multivibrator circuit according to the prior art.

Due to this, the operating voltage can be dropped to the area of about 0.8 to 1 V, while Vcc in the circuit of FIG. 1 is about 1.5 V or higher.

In addition, the coils L1 to L6 intensify the amplification during the avalanche process when the transistor Q1 or Q2 is switched on. To begin with, the operation of a multivibrator is examined in greater detail. Initially, it is assumed that Q1 is off (non-conduction state). When Q1 is off, the collector of Q1 and the base of Q4 are generally at the operating voltage potential Vcc at the resonance frequency. Then Q4 is on (conducting state), due to which the base potential of Q2 is about Vcc-06 V. Thus Q2 is on and its emitter current I1 flows from the emitter of Q2 via the capacitance C to the emitter of Q1. Then the current I1 charges/discharges the charge of the capacitance C, whereby the emitter potential of Q1 falls at a predetermined speed at the resonance frequency, until Q1 becomes conductive when the base emitter voltage exceeds about 0.6 V. When Q1 becomes conductive, its collector voltage begins to fall. Because the collector of Q1 is connected via the buffer transistor Q4 to the base of Q2 (positive feedback), the base voltage of Q2 also falls and Q2 begins to close. When Q2 is closing, its collector voltage increases, which opens the buffer transistor Q3. The opening of the buffer transistor Q3 increases the base current of Q1 and accelerates the opening of Q1, etc. A movement of avalanche type from one state to another takes place in this way. When Q2 is off and Q1 is on, the current I2 flows from the emitter of Q1 via the capacitance C to the emitter of Q2, where the emitter voltage begins to fall until it makes Q2 open and Q1 close again. As it was stated previously, the resonance frequency must be high enough, higher than about 1 GHz, so that an oscillation signal does not short-circuit via the coils L1 to L6 to the voltage source like a DC signal does. The maximum resonance frequency to be achieved by a multivibrator circuit depends primarily on the properties of the transistors Q1 to Q4, i.e. on the speed at which they can be connected from one state to another. The increase in speed provided by the coils L1 to L6 is based mainly on the impedance depending on their frequency.

Since the currents flowing through the pairs of coils L1 and L2, L3 and L4, L5 and L6 have a strong functional dependence on each other, the speed of the circuit can be increased further by providing an electromagnetic coupling between the coils in such a way that the currents flowing in those have an electromagnetic interaction intensifying the positive feedback between the amplifier components of the multivibrator.

Figure 3:
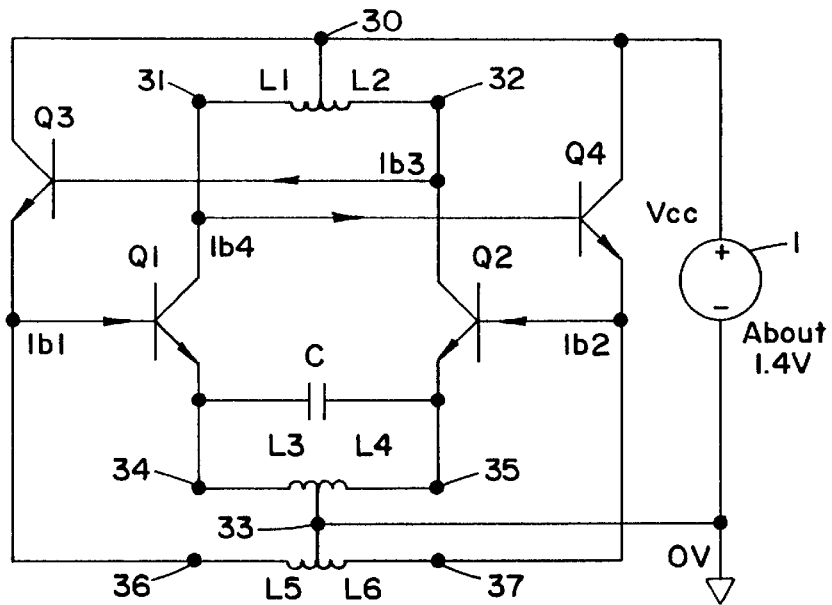

FIG. 3 shows a multivibrator circuit of the invention, in which an electromagnetic coupling is provided between coils L1 and L2, coils L3 and L4 and coils L5 and L6. In FIG. 3, the coils L1 and L2 are implemented by one coil provided with a tap. The tap is connected to an operating voltage Vcc, one end terminal 31 of the coil to a collector of the transistor Q2 and the other end terminal 32 of the coil to the collector of the transistor Q2. So the coil L1 is formed between the tap 30 and the end terminal 31 and the coil L2 is formed between the tap 30 and the end terminal 32. The coils L3 and L4 are implemented in the same way by a coil provided with a tap. The tap 33 of the coil is connected to an operating voltage potential 0 V, an end terminal 34 to an emitter of the transistor Q1 and an end terminal 35 to an emitter of the transistor Q2. Further, the coils L5 and L6 are implemented in the same way by a coil provided with a tap. The tap 33 of the coil is connected to the operating voltage potential 0 V, an end terminal 36 to an emitter of the transistor Q3 and an end terminal 37 to an emitter of the transistor Q4.

The operation of the circuit of FIG. 3 is examined as follows. To begin with, it is assumed that Q1 is off and Q2 is conductive. Then a collector current $I_{C2}$ of the transistor Q2 flowing through the coil L2 and a base current $I_{B2}$ of Q2 flowing through the coil L1 are at the highest. Correspondingly, Q1 has a collector current $I_{C1}=0$ and a base current $I_{B1}=0$. When Q1 begins to open and Q2 to close, as was described in connection with FIG. 2, the collector current $I_{C1}$, of Q1 flowing through the coil L1 and the base current $I_{B1}$ of Q1 flowing through the coil L2 begin to increase, the electromagnetic coupling between the coils L1 and L2 causing that the increasing current $I_{C1}$ in the coil L1 induces an extra current in the coil L2, accelerating the increase of a base current $I_{B3}$ of Q3. On the other hand, the increased base current $I_{B3}$ discharges parasitic capacitances of a base electrode of Q3 faster and accelerates thus the opening of Q3. The opening of Q3 increases in turn the base current $I_{B1}$ of Q1 further. The increased base current $I_{B1}$ discharges parasitic capacitances of a base electrode of Q1 faster and accelerates thus the opening of Q1. This again increases the current $I_{C1}$ further, which in turn increases the current $I_{B3}$ through the coils L1 and L2, etc. This continues till Q1 is fully open and Q2 closed, i.e. $I_{C1}$ and $I_{B1}$ are at the highest and $I_{C2}:I_{B2}=0$. Subsequently, Q2 begins to open and Q1 to close again, the currents $I_{C2}$ and $I_{B2}$ amplifying each other via the coils L1 and L2. A positive "electromagnetic feedback" is provided in this way, which feedback amplifies the conventional positive feedback of the multivibrator circuit.

Correspondingly, changes in the currents flowing through the coils L3 and L4 as well as L5 and L6 amplify each other and increase thus the positive feedback between the transistors Q1 and Q2 and the speed of the whole circuit.

Figure 4:
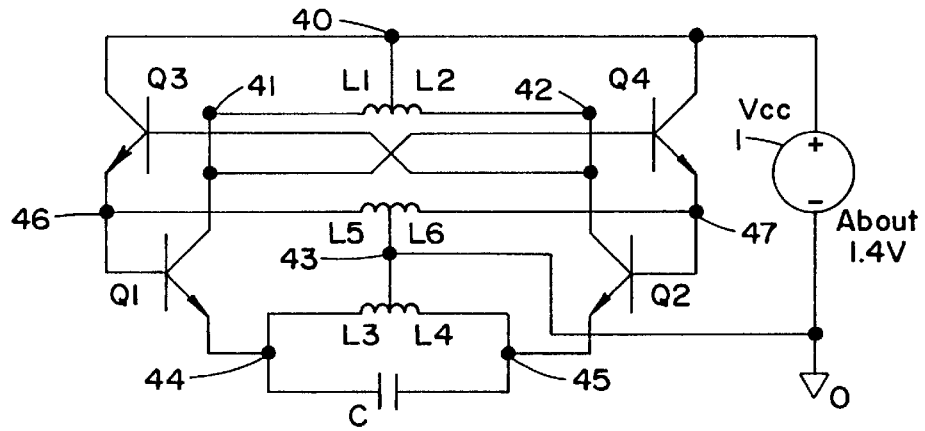

The operation of the multivibrator circuit according to the invention can be accelerated further by providing an electromagnetic coupling between all coils L1 to L6. One such solution is shown in FIG. 4, where the coils L1 to L6 are implemented by a transformer T1 having three windings M1, M2 and M3 provided with a tap. The tap 40 of the winding M1 is connected to the operating voltage Vcc of the voltage source 1, an end terminal 41 is connected to the collector of the transistor Q1 and an end terminal 42 is connected to the collector of the transistor Q2. The coil L1 is formed between the tap 40 and the terminal 41. The coil L2 is formed between the tap 40 and the terminal 42. A tap 43 of the winding M2 is connected to the potential 0 V of the voltage source 1, an end terminal 44 is connected to the emitter of the transistor Q1 and an end terminal 45 is connected to the emitter of the transistor Q2. The coil L3 is formed between the tap 43 and the terminal 44. The coil L4 is formed between the tap 43 and the terminal 45. The tap 43 of the winding M3 is connected to the potential 0 V of the voltage source 1, an end terminal 46 to the emitter of the transistor Q3 and an end terminal 47 to the emitter of the transistor Q4. The coil L5 is formed between the tap 43 and the end terminal 46. The coil L6 is formed between the tap and the end terminal 47.

There is an electromagnetic coupling between the coils L1 and L2 and between the coils L3 and L4, as was described above in connection with FIG. 3. Also the windings M1, M2 and M3 of the transistor T1 have a mutual electromagnetic coupling. This implies that the currents flowing in the coils L1 and L2 affect inductively the currents flowing in the coils L3 to L6 and the opposite. In other words, there is a positive feedback accelerating the avalanche pro-cess also between the collector circuit and the emitter circuit. In this way it is possible to provide the strongest possible multipath positive feedback and the highest possible speed for the avalanche process. For instance, the current flowing through the coil L4 and increasing when the transistor Q1 opens can be arranged to amplify the base current of the transistor Q1 flowing through the coil L2. A higher base current accelerates the opening of Q3, which again accelerates the opening of Q1 and increases the current flowing in the coil L4, which increases through the coil L2 the base current of Q1, etc. The other currents flowing through the coils L1 to L6 can be arranged in the same way to interact inductively in such a way that they amplify the positive feedback.

Figure 5:
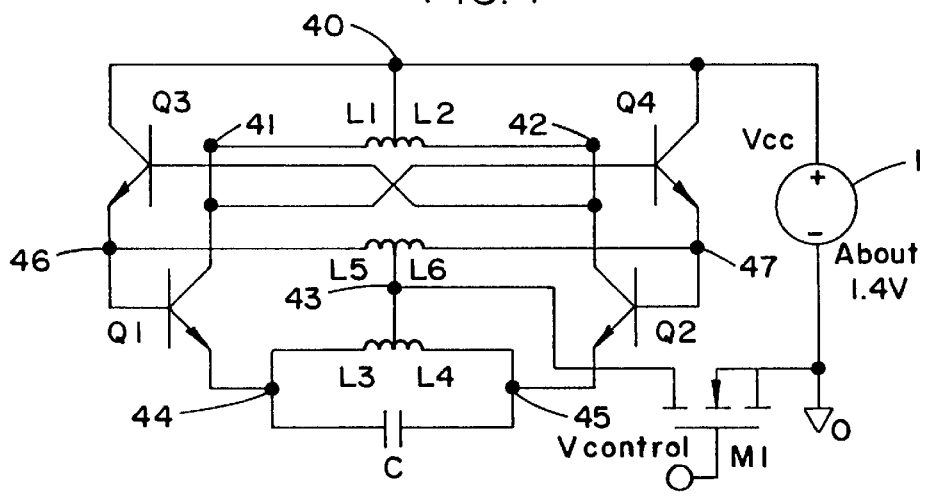
FIG. 5 is a circuit diagram showing a multivibrator circuit according to the invention, provided with frequency control.

FIG. 5 shows a voltage-controlled oscillator (VCO) implemented by using the multivibrator coupling of FIG. 4. In the multivibrator circuit according to the invention, reactive impedances of the capacitor C and the coils L1, L2, L3 and L4 connected to it determine the current flowing through those during the avalanche process. It is important that the control of this current leads to the control of the resonance frequency. This enables a very simple control of the resonance frequency compared to the conventional solutions, where the value of the capacitor C or some of the coils L1 to L4 is controlled.

In the oscillator coupling shown in FIG. 5, a coupling point between the coils L3 and L4, i.e. the tap 43, is connected to the operating voltage potential 0 V of the voltage source 1 by a series transistor M1 of N-MOS type. The current flowing through the transistor M1 is controlled by a control voltage $V_{control}$ at the gate of the transistor M1. The current through the transistor M1 controls in turn the current flowing through the capacitor C during the avalanche process and thus the resonance frequency. Depending on which component of the resonance circuit has the dominating role, the capacitor C or the coils L1 to L4, an increase of the control current through the transistor M1 leads to an increase or a decrease of the frequency provided by the oscillator or does not affect it at all. A decrease of the control current provides an opposite phenomenon.

Though the transistor M1 is a N-MOS transistor in the example of FIG. 5, any type of transistor, such as P-MOS, NPN and PNP transistors, can be used instead, or any type of component controlling the current, in principle.

Alternatively, the transistor M1 or another similar current control means can be placed in the power supply line between the operating voltage terminal Vcc of the voltage source 1 and the coils L1 and L2.

By means of the multivibrator according to the invention, it is easy to realize a current-controlled oscillator (ICO) as well. The VCO of FIG. 5 can easily be made to an ICO, when the control current is fed, instead by the transistor M1, by some suitable method, such as a current mirror, an amplifying stage, etc.

The multivibrator according to the invention and the ICO and VCO oscillators based on it are much faster, require a, lower voltage feed for a higher amplitude and comprise a simpler frequency control than the conventional multivibrators and oscillators. In an integrated circuit embodiment implemented e.g. by 0.8 $\mu$m BiCMOS technique and using coils with a low Q value, the multivibrator according to the invention provides a 0.8 V amplitude even at 10 GHz frequency, at a power consumption lower than 1 mW from the 1.5 V operating voltage.

The drawings and the related description are only intended to illustrate the invention. The details of the invention may vary within the scope and spirit of the attached claims.

We claim:

1. Multivibrator circuit, comprising an operating voltage source, a first non-linear amplifier component comprising a first and a second main electrode and a control electrode, a second non-linear amplifier component comprising a first and a second main electrode and a control electrode, a third amplifier component comprising first and second main electrodes which are connected to the control electrode of the first amplifier component and to a first potential of the operating voltage source, respectively, and a control electrode which is connected to the first main electrode of the second amplifier component in such a way that a positive feedback is provided, a fourth amplifier component comprising first and second main electrodes which are connected to the control electrode of the second amplifier component and to the first potential of the operating voltage source, respectively, and a control electrode which is connected to the first main electrode of the first amplifier component in such a way that a positive feedback is provided, a capacitive component connected between the second main electrode of the first amplifier component and the second main electrode of the second amplifier component, a first inductive component, via which the first main electrode of the first amplifier component is connected to the first potential of the operating voltage source, a second inductive component, via which the first main electrode of the second amplifier component is connected to the first potential of the operating voltage source, a third inductive component, via which the second main electrode of the first amplifier component is connected to a second potential of the operating voltage source, a fourth inductive component, via which the second main electrode of the second amplifier component is connected to the second potential of the operating voltage source.

2. Multivibrator circuit according to claim 1, comprising a fifth component, via which the control electrode of the first amplifier component is connected to the second potential of the operating voltage source, a sixth inductive component, via which the control electrode of the second amplifier component is connected to the second potential of the operating voltage source.

3. Multivibrator circuit according to claim 2, wherein
at least two of said first, second, third, fourth, fifth and sixth inductive components have a mutual electromagnetic coupling.

4. Multivibrator circuit according to claim 2, wherein there is a mutual electromagnetic coupling between the first and the second inductive components, between the third and the fourth inductive components, between the fifth and the sixth inductive components or between all inductive components.

5. Multivibrator circuit according to any of the claims 2 to 4, comprising a first coil comprising a first switching terminal connected to the second main electrode of the first amplifier component, a second switching terminal connected to the second main electrode of the second amplifier component and a tap operationally connected to the second potential of the operating voltage source and that the part of the first coil which is between the first switching terminal and the tap constitutes said third inductive component and that the part of the first coil which is between the second switching terminal and the tap constitutes said fourth inductive component.

6. Multivibrator according to claim 5, comprising a second coil comprising a first switching terminal connected to the first main electrode of the first amplifier component, a second switching terminal connected to the first main electrode of the second amplifier component and a tap operationally connected to the first potential of the operating voltage source, and wherein the part of the second coil which is between the first switching terminal and the tap constitutes said first inductive component and that the part of the second coil which is between the second switching terminal and the tap constitutes said second inductive component.

7. Multivibrator according to claim 6, comprising a third coil comprising a first switching terminal connected to the second main electrode of the third amplifier component, a second switching terminal connected to the second main electrode of the fourth amplifier component and a tap operationally connected to the second potential of the operating voltage source and that the part of the third coil which is between the first switching terminal and the tap constitutes said fifth inductive component and that the part of the second coil which is between the second switching terminal and the tap constitutes said sixth inductive component.

8. Multivibrator according to claim 4, wherein the first, second, third and fourth inductive components are windings of a transformer.

9. Multivibrator according to claim 8, wherein the transformer comprises
a first winding having a first switching terminal connected to the second main electrode of the first amplifier component, a second switching terminal connected to the second main electrode of the second amplifier component and a tap operationally connected to the second potential of the operating voltage source, and that the part of the first winding which is between the first switching terminal and the tap constitutes said third inductive component and that the part of the first winding which is between the second switching terminal and the tap constitutes said fourth inductive component, a second winding having a first switching terminal connected to the first main electrode of the first amplifier component, a second switching terminal connected to the first main electrode of the second amplifier component and a tap operationally connected to the first potential of the operating voltage source, and that the part of the second winding which is between the first switching terminal and the tap constitutes said first inductive component and that the part of the second winding which is between the second switching terminal and the tap constitutes said second inductive component.

10. Multivibrator according to claim 9, wherein said transformer further comprises
a third winding having a first switching terminal connected to the second main electrode of the third amplifier component, a second switching terminal connected to the second main electrode of the fourth amplifier component and a tap operationally connected to the second potential of the operating voltage source and that the part of third winding which is between the first switching terminal and the tap constitutes said fifth inductive component and that the part of the third winding which is between the second switching terminal and the tap constitutes said sixth inductive component.

11. Multivibrator according to claim 1, further including means for controlling the oscillation frequency of the multivibrator, which controls currents flowing through the third and fourth inductive components from the second potential of said operating voltage source and is controlled by an external frequency control signal.

* * * * *